(12) United States Patent
Yaklin et al.

(10) Patent No.: US 12,324,093 B2
(45) Date of Patent: Jun. 3, 2025

(54) SINGLE CIRCUIT BOARD ASSEMBLY WITH LOGIC AND POWER COMPONENTS

(71) Applicant: Steering Solutions IP Holding Corporation, Saginaw, MI (US)

(72) Inventors: Ryan D. Yaklin, Chesaning, MI (US); Piotr Karasinski, Slaskie (PL)

(73) Assignee: Steering Solutions IP Holding Corporation, Saginaw, MI (US)

( * ) Notice: Subject to any disclaimer, the term of this patent is extended or adjusted under 35 U.S.C. 154(b) by 409 days.

(21) Appl. No.: 17/824,613

(22) Filed: May 25, 2022

(65) Prior Publication Data

US 2022/0394848 A1    Dec. 8, 2022

Related U.S. Application Data

(60) Provisional application No. 63/196,832, filed on Jun. 4, 2021.

(51) Int. Cl.
*H05K 1/02* (2006.01)
*H02K 11/30* (2016.01)
*H05K 1/18* (2006.01)
*H05K 7/20* (2006.01)

(52) U.S. Cl.
CPC ........... *H05K 1/0298* (2013.01); *H02K 11/30* (2016.01); *H05K 1/18* (2013.01); *H05K 7/209* (2013.01); *H05K 2201/09518* (2013.01); *H05K 2201/09536* (2013.01); *H05K 2201/10166* (2013.01); *H05K 2201/10545* (2013.01)

(58) Field of Classification Search
CPC ............... H02K 11/30; H02K 5/04; H05K 2201/10545; H05K 1/0298
See application file for complete search history.

(56) References Cited

U.S. PATENT DOCUMENTS

| | | | |
|---|---|---|---|
| 5,888,631 A * | 3/1999 | Sylvester | H05K 3/4688 428/209 |
| 6,477,060 B1 * | 11/2002 | Peter | H05K 1/0237 257/702 |
| 2004/0040744 A1 * | 3/2004 | Wyrzykowska | H05K 1/112 174/262 |
| 2016/0324015 A1 * | 11/2016 | Mutsuura | H05K 7/1417 |
| 2017/0367185 A1 * | 12/2017 | Roessler | H05K 3/0047 |
| 2019/0115806 A1 * | 4/2019 | Yamashita | H05K 7/20 |
| 2019/0207488 A1 * | 7/2019 | Ichikawa | H02K 5/10 |
| 2020/0016734 A1 * | 1/2020 | Kelleher | H02K 5/10 |
| 2020/0146148 A1 * | 5/2020 | Higashide | H05K 5/006 |

* cited by examiner

*Primary Examiner* — Terrance L Kenerly
*Assistant Examiner* — Theodore L Perkins
(74) *Attorney, Agent, or Firm* — Dickinson Wright PLLC

(57) ABSTRACT

A single circuit board assembly for forming a vehicle-motor interface, the single circuit board assembly includes a first side of a board with logic modules located thereon. The single circuit board assembly also includes a second side of the board with power modules located thereon. The board comprises a plurality of layers, the plurality of layers having at least one through via and at least one buried via defined therein, wherein the at least one through via extends through all of the plurality of layers, the at least one buried via extending through less than all of the plurality of layers.

11 Claims, 6 Drawing Sheets

US 12,324,093 B2

SINGLE CIRCUIT BOARD ASSEMBLY WITH LOGIC AND POWER COMPONENTS

CROSS-REFERENCE TO RELATED APPLICATION

This application claims the benefits of priority to U.S. Provisional Patent Application Ser. No. 63/196,832, filed Jun. 4, 2021, the disclosure of which is incorporated by reference herein in its entirety.

TECHNICAL FIELD

This disclosure relates to a circuit board assembly and, in particular, to a single circuit board assembly with both logic and power components.

BACKGROUND

A vehicle, such as a car, truck, sport utility vehicle, crossover, mini-van, marine craft, aircraft, all-terrain vehicle, recreational vehicle, or other suitable vehicles, typically include various electric motor-vehicle interface locations. Electric motors may be used throughout the vehicle for a variety of functions, such as power steering, steering column adjustment, and other functionalities. These motors typically receive instructions from a circuit board assembly that facilitates the motor-vehicle interface. Circuit boards (e.g., a printed circuit board) locate and connect various electronic components and thus design and packaging considerations are important for end-use.

Typical motor-vehicle interfaces require a multi-circuit board configuration wherein a series of single-sided circuit boards locate and connect logic components and high power components. The series of single-sided circuit boards are then electrically connected via a number of conduction intermediaries to form the multi-circuit board configuration. The multi-circuit board configuration is then electrically connected to a motor. While the multi-circuit board configuration is functionally operable, packaging options are limited by the size. FIGS. 1 and 2 generally illustrate one example of such a multi-board assembly in a disassembled condition.

Accordingly, there is a continuing interest in reducing the size of the traditional circuit board configurations to adhere to reduced packaging space requirements without detracting from functionality.

SUMMARY OF THE DISCLOSURE

According to one aspect of the disclosure, a single circuit board assembly for forming a vehicle-motor interface, the single circuit board assembly includes a first side of a board with logic modules located thereon. The single circuit board assembly also includes a second side of the board with power modules located thereon. The board comprises a plurality of layers, the plurality of layers having at least one through via and at least one buried via defined therein, wherein the at least one through via extends through all of the plurality of layers, the at least one buried via extending through less than all of the plurality of layers.

According to another aspect of the disclosure, a single circuit board assembly for forming a vehicle-motor interface, the single circuit board assembly includes a single board with at least one power module and at least one logic module located thereon. The board comprises a plurality of layers, the plurality of layers each formed of copper and having at least one through via and at least one buried via defined therein, wherein the at least one through via extends through all of the plurality of layers, the at least one buried via extending through less than all of the plurality of layers.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The following discussion is directed to various embodiments of the disclosure. The embodiments disclosed herein should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, a vehicle, such as a car, truck, sport utility vehicle, crossover, mini-van, marine craft, aircraft, all-terrain vehicle, recreational vehicle, or other suitable vehicles, typically include various motor-vehicle interface locations. The motors described herein may be used throughout the vehicle for a variety of functions, such as power steering, steering column adjustment, and other functionalities.

Figure 1:
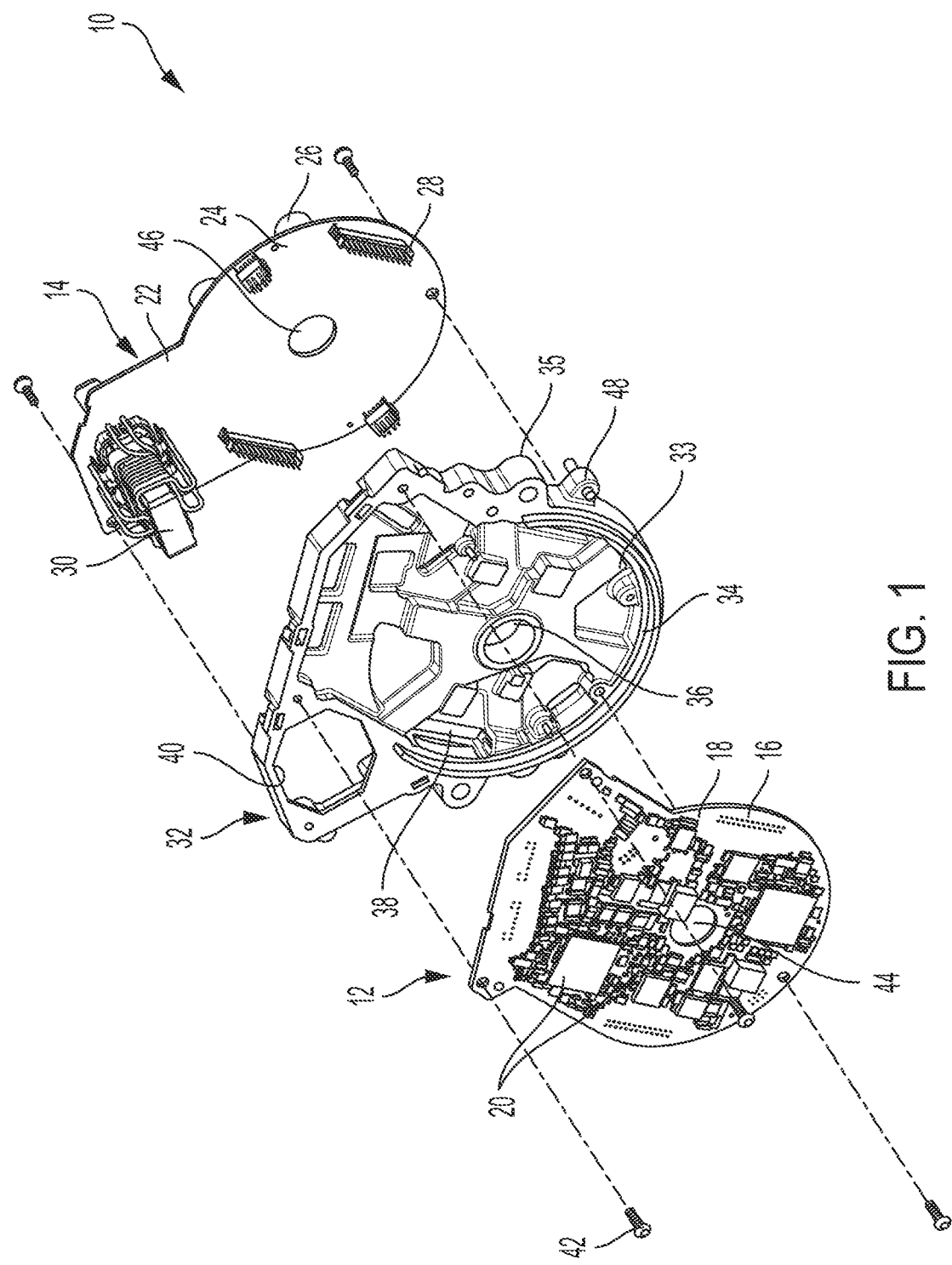
FIG. 1 generally illustrates a single circuit board assembly according to a prior art circuit board assembly requiring multiple boards.
Figure 2:
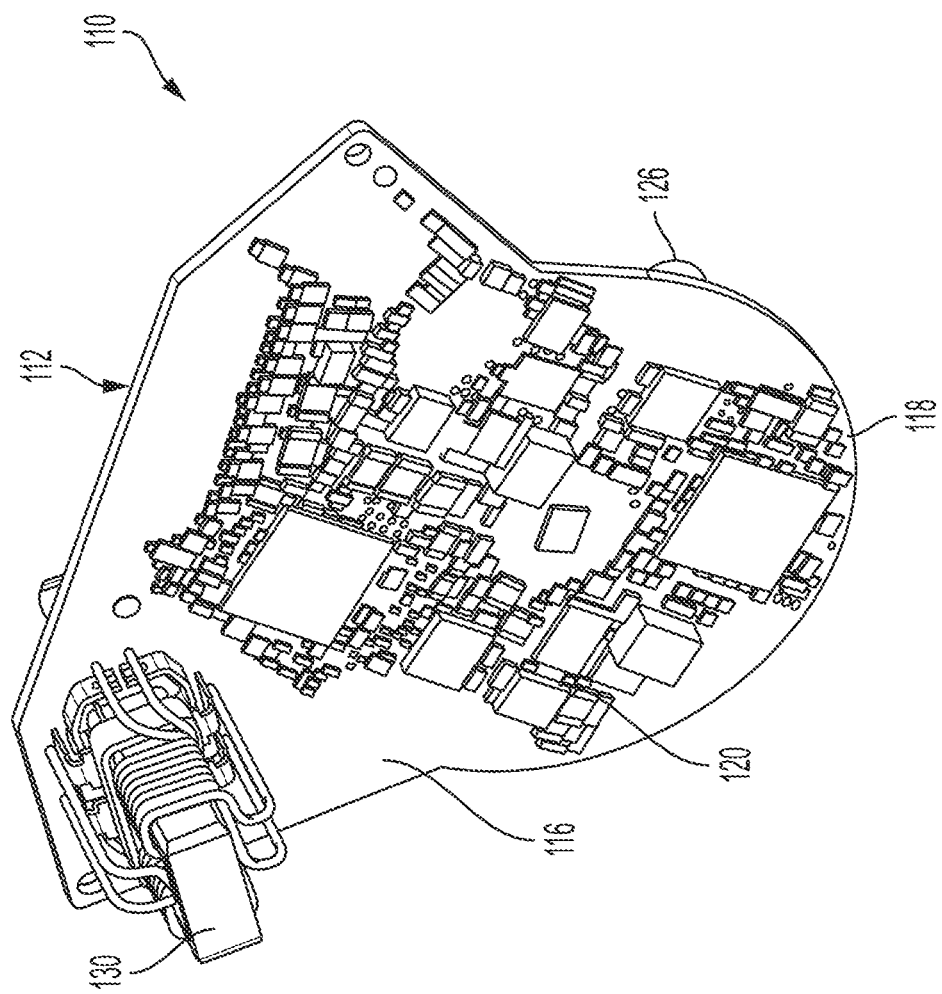
FIG. 2 is a perspective view of a first side of a single circuit board assembly according to the present disclosure.
Figure 3:
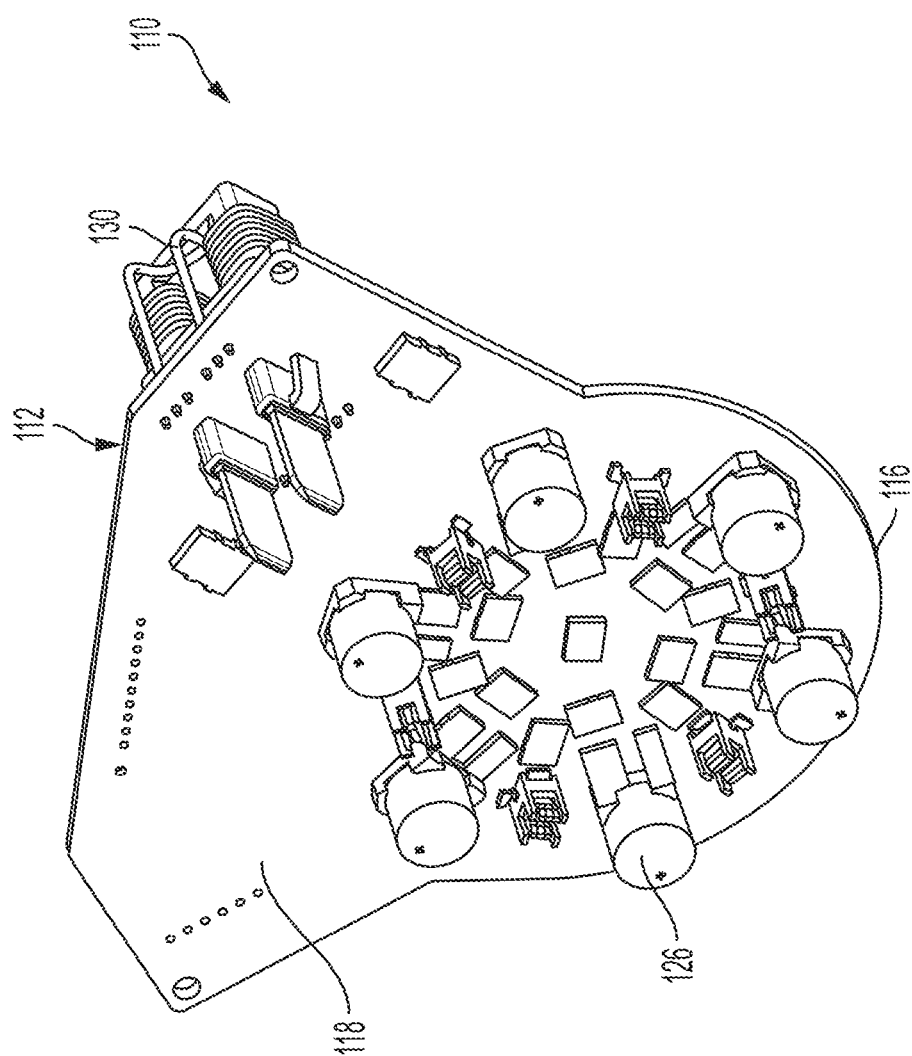
FIG. 3 is a perspective view of a second side of the single circuit board assembly.
Figure 4:
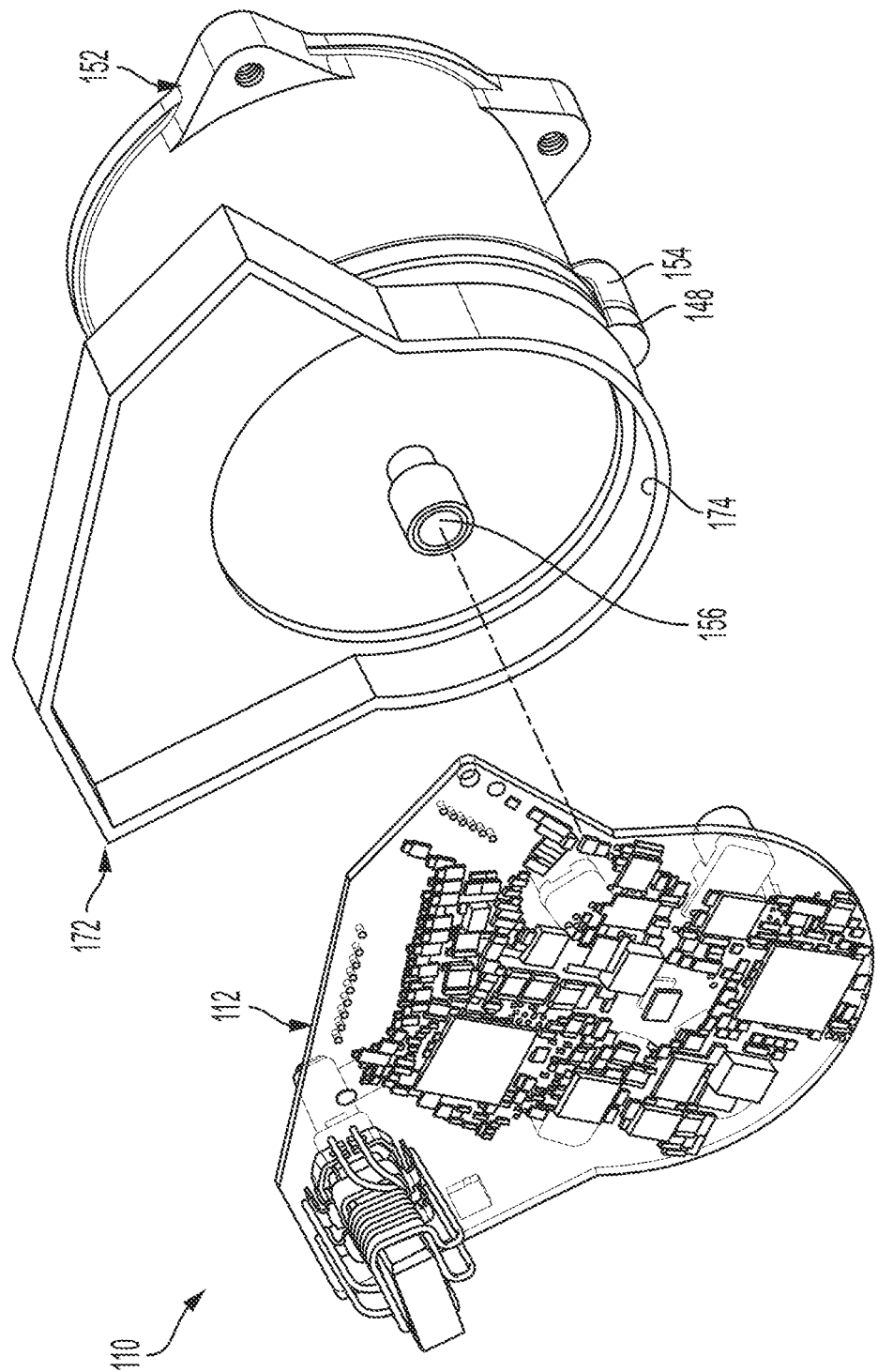
FIG. 4 generally illustrates the single circuit board assembly and a motor assembly according to the principles of the present disclosure.

FIGS. 2 and 3 illustrate a circuit board assembly 110 in accordance with a second embodiment. The circuit board assembly 110 in accordance with the second embodiment utilizes a single circuit board 112 that includes a first side 116 and a second side 118. In some embodiments, the first side 116 includes a series of logic modules 120 and the second side 118 includes a series of power modules 126, such as high powered FETS, shunts, and other components. The second side 118 may further include a motor connection module 130 for connecting to a motor assembly 152 (FIG. 4). By locating the power modules 126 (e.g., the high powered FETS) on the second side 118, they can be accessible for cooling. A conduction assembly 132 (FIG. 6) may be located between the first side 116 and the second side 118.

In some embodiments, the logic modules 120 and the power modules 126 are located directly across from each other.

Figure 5:
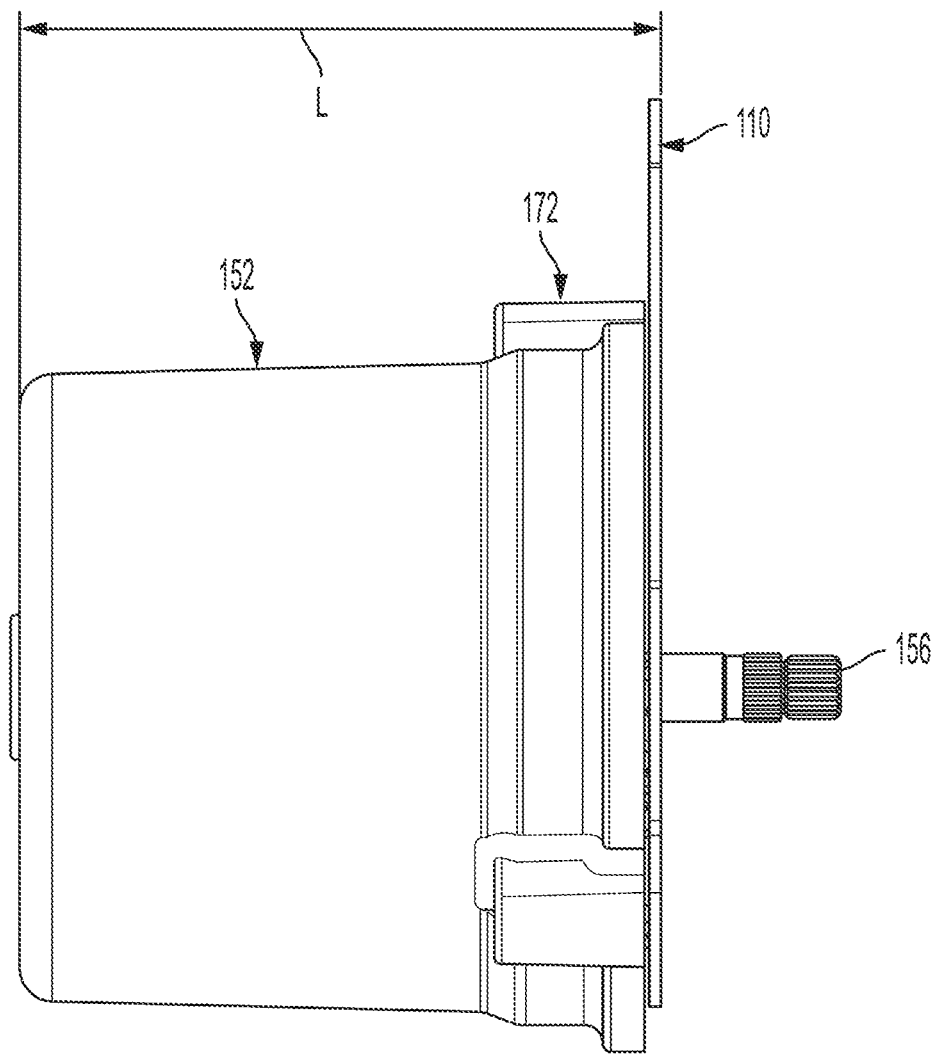
FIG. 5 generally illustrates the single circuit board assembly and a motor assembly from a side view according to the principles of the present disclosure.

FIG. 4 illustrates the circuit board assembly 110 and a motor assembly 152 spaced therefrom for connection. The motor assembly 152 includes a heat sink assembly 172 for locating the circuit board assembly 110. The heat sink assembly 172 includes motor mounting tabs 148 for connecting to heat sink tabs 154 on the motor assembly 152. The heat sink assembly 172 may define a pocket 174 for locating the circuit board assembly 110. A hole may be located within the pocket 174 and the circuit board assembly 110 (not shown) for locating a motor shaft 156. FIG. 5 illustrates a side view of the circuit board assembly 110 connected to the motor assembly 152. In some embodiments, the circuit board assembly 110 and the motor assembly 152 may be less than approximately 100 mm. in length, or approximately 93 mm. in length, exhibiting a further reduction in packaging space requirements.

Figure 6:
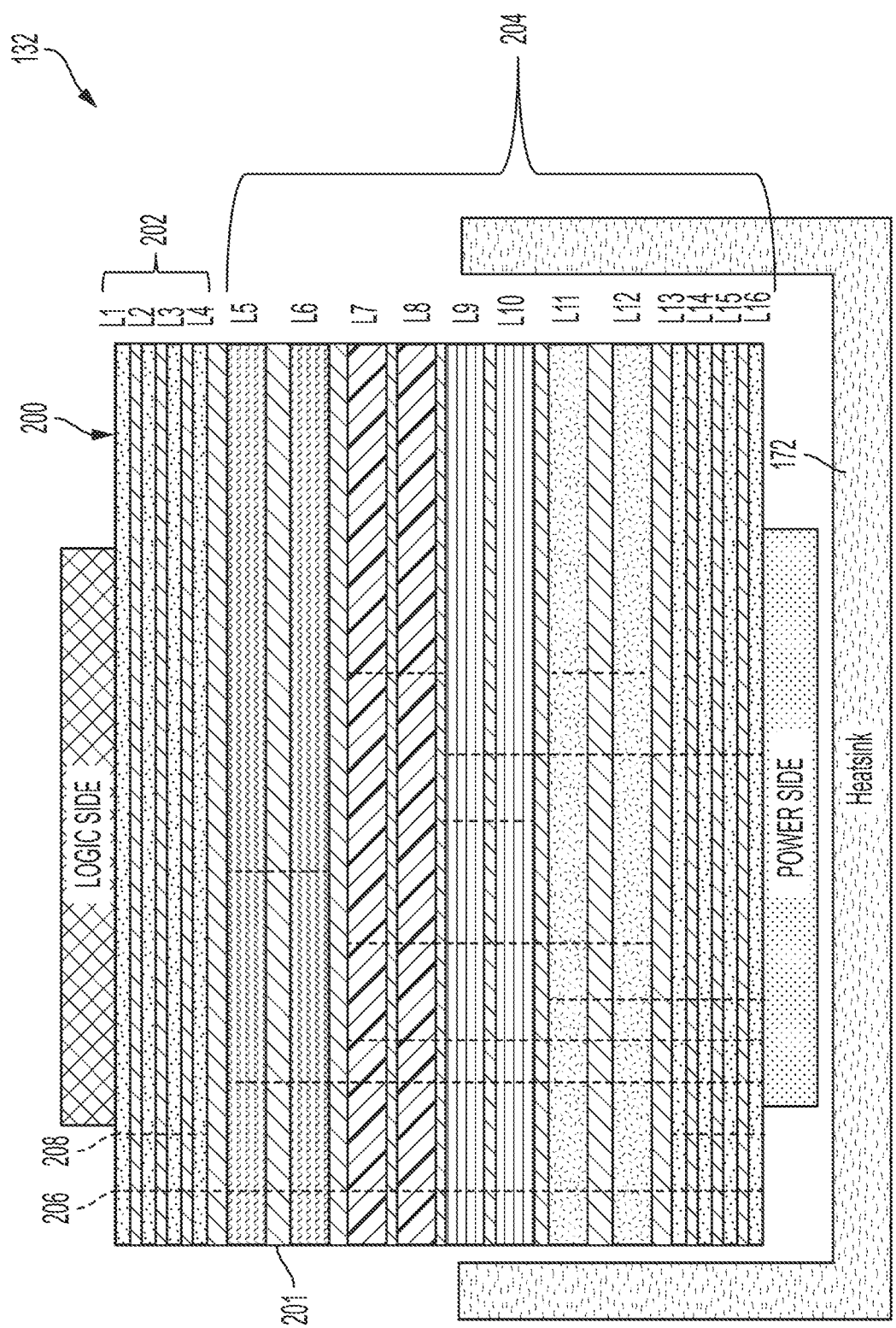
FIG. 6 generally illustrates a cross-sectional view of a conduction assembly according to the principles of the present disclosure.

FIG. 6 illustrates a cross-sectional view of the conduction assembly 132 that may be utilized in accordance with the first and second embodiments. The conduction assembly 132 includes a plurality of conduction layers 200. In some embodiments, the plurality of conduction layers 200 may be formed of copper. In some embodiments, each of the layers 200 may weigh less than approximately 2.0 oz. and more than approximately 0.25 oz., for example, approximately 1 oz. Each layer 200 may be spaced from adjacent layers 200 by spaces 201. The weight of the layers 200 may enable the smaller spaces 201 during the circuit board fabrication copper etching process. The plurality of conduction layers 200 may include a first plurality of layers 202 for facilitating logic signals from the logic modules 120 and a second plurality of layers 204 for facilitating high current signals from the power modules 126. In some embodiments, the first plurality of layers 202 are fewer in number than the second plurality of layers 204. In some embodiments, the first plurality of layers 202 have a different thickness than the second plurality of layers 204. In the illustrative embodiment, the plurality of conduction layers 200 include 16 copper layers of which the first plurality of layers 202 includes 4 copper layers and the second plurality of layers 204 includes 12 copper layers.

In some embodiments, the second plurality of layers 204 are sub-divided as having different thicknesses amount certain groups. For example, the second plurality of layers 204 may have a plurality of layers adjacent the second side of the board and another group of layers may be located between the first plurality of layers 202 and the layers immediately adjacent the second side. In some embodiments, the middle layers may have a thickness that is greater than the first plurality of layers 202 and the layers immediately adjacent the second side.

With continued reference to FIG. 6, the heat sink assembly 32, 132 may include thru vias 206 extending through each layer 200 and buried vias 208 extending through only certain layers 200. The different types of vias separate the high power electrical connection (of the power modules) routing from the logic copper routing (of the logic modules). The quantity, ratio, and distribution of different via connection 206, 208 types from layer-to-layer 200 may be less than or greater than what is shown in FIG. 6. The vias 206, 208 permit electrical current passage from one layer 200 of copper to another layer 200 of copper. The vias 206, 208 may be formed with a drill that goes from one layer to another and then is put in a fabrication plating process that plates copper on the wall of the hole making electrical connection from one layer 200 of copper to another layer 200 of copper. The standardized 0.25 oz. to 2.0 oz. configuration on every layer 200 permits scalability based on the logic module and power module needs.

Advantageously, the embodiments disclosed herein provide high powered and logic components on the same circuit board.

While the invention has been described in detail in connection with only a limited number of embodiments, it is to be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Moreover, any feature, element, component or advantage of any one embodiment can be used on any of the other embodiments. Accordingly, the invention is not to be seen as limited by the foregoing description

What is claimed is:

1. A single circuit board assembly for forming a vehicle-motor interface, the single circuit board assembly comprising:
   a first side of a board with logic modules located thereon;
   a second side of the board with power modules located thereon;
   wherein the board comprises a plurality of layers, the plurality of layers having at least one through via and at least one buried via defined therein, wherein the at least one through via extends through all of the plurality of layers, the at least one buried via extending through less than all of the plurality of layers; and
   a heat sink assembly defining a pocket for receiving the board therein, wherein the second side of the board is adjacent to a main pocket wall of the heat sink assembly, wherein the heat sink assembly includes at least one motor mounting tab aligned and secured to at least one tab on a motor assembly housing, wherein an axial length of the motor assembly housing, the heat sink assembly and the board is less than 100 millimeters.

2. The single circuit board assembly of claim 1, wherein each of the layers are formed of copper.

3. The single circuit board assembly of claim 1, wherein at least one of the plurality of layers have a thickness that is different than at least one of the other plurality of layers.

4. The single circuit board assembly of claim 1, wherein the plurality of layers of the board includes a first plurality of layers, a second plurality of layers and a third plurality of layers, the first plurality of layers located adjacent the first side of the board, the second plurality of layers located adjacent the second side of the board, and the third plurality of layers located between the first and second plurality of layers, wherein each of the first plurality of layers and each of the second plurality of layers have a thickness that is less than a thickness of the third plurality of layers.

5. The single circuit board assembly of claim 1, wherein an axial length of the motor assembly housing, the heat sink assembly and the board is approximately 93 millimeters.

6. The single circuit board assembly of claim 2, wherein each of the layers are formed of copper weighing from 0.25 oz. to 2.0 oz.

7. A single circuit board assembly for forming a vehicle-motor interface, the single circuit board assembly comprising:

a single board with at least one power module and at least one logic module located thereon;

wherein the board comprises a plurality of layers, the plurality of layers each formed of copper and having at least one through via and at least one buried via defined therein, wherein the at least one through via extends through all of the plurality of layers, the at least one buried via extending through less than all of the plurality of layers; and a heat sink assembly defining a pocket for receiving the board therein, wherein the second side of the board is adjacent to a main pocket wall of the heat sink assembly, wherein the heat sink assembly includes at least one motor mounting tab aligned and secured to at least one tab on a motor assembly housing, wherein an axial length of the motor assembly housing, the heat sink assembly and the board is less than 100 millimeters.

8. The single circuit board assembly of claim 7, wherein each of the layers are formed of copper weighing from 0.25 oz. to 2.0 oz.

9. The single circuit board assembly of claim 7, wherein at least one of the plurality of layers have a thickness that is different than at least one of the other plurality of layers.

10. The single circuit board assembly of claim 7, wherein the plurality of layers of the board includes a first plurality of layers, a second plurality of layers and a third plurality of layers, the first plurality of layers located adjacent the first side of the board, the second plurality of layers located adjacent the second side of the board, and the third plurality of layers located between the first and second plurality of layers, wherein each of the first plurality of layers and each of the second plurality of layers have a thickness that is less than a thickness of the third plurality of layers.

11. The single circuit board assembly of claim 7, wherein an axial length of the motor assembly housing, the heat sink assembly and the board is approximately 93 millimeters.

* * * * *